（12）United States Patent
Lee et al.

(10) Patent No.: US 6,407,342 B1
(45) Date of Patent: Jun. 18, 2002

(54) PRINTED CIRCUIT BOARD CAPABLE OF PREVENTING ELECTRICAL SHORT DURING SOLDERING PROCESS

(75) Inventors: Sung-Mo Lee, Kyungki-Do; Myung-Hwa Jeong, Kyunggi-do, both of (KR)

(73) Assignee: Samsung Electronics Co., Ltd, Suwon (KR)

( * ) Notice: Subject to any disclaimer, the term of this patent is extended or adjusted under 35 U.S.C. 154(b) by 0 days.

(21) Appl. No.: 09/522,844

(22) Filed: Mar. 10, 2000

(30) Foreign Application Priority Data

Mar. 13, 1999 (KR) ............................................. 99-8509

(51) Int. Cl.$^7$ ................................................ H05K 1/16
(52) U.S. Cl. ...................................... 174/260; 174/263
(58) Field of Search ................................ 174/255, 256, 174/258, 263, 267, 260, 261; 361/760, 772, 783

(56) References Cited

U.S. PATENT DOCUMENTS

| 4,339,784 A | 7/1982 | Shearer |
| 4,628,409 A | * 12/1986 | Thompson et al. ......... 361/403 |
| 4,835,345 A | 5/1989 | Haarde |
| 5,000,691 A | 3/1991 | Olsson |
| 5,092,035 A | 3/1992 | McMichen et al. |
| 5,242,100 A | 9/1993 | Weeks |
| 5,243,143 A | 9/1993 | Throop et al. |
| 5,604,333 A | 2/1997 | Kennish et al. |

* cited by examiner

*Primary Examiner*—Kamand Cuneo
*Assistant Examiner*—Jeremy Norris
(74) *Attorney, Agent, or Firm*—Robert E. Bushnell, Esq.

(57) ABSTRACT

A printed circuit board containing pin-through holes includes components for mounting on the printed circuit board to be electrically connected with the printed circuit board, wherein each of the components includes a plurality of pins for inserting into the pin-through holes, patterns formed on the printed circuit board, wherein the patterns are located adjacent to a last one hole among the arranged pin-through holes, and at least one zone formed on at least one of the patterns, wherein a surface of the at least one zone is capable of being soldered, and wherein the at least one zone is formed on the same line passing through the plurality of pins and to absorb an excess amount of the solder at the last one hole, which prevents an electrical short due to the excess solidification of the solder at the last solder.

24 Claims, 2 Drawing Sheets

PRINTED CIRCUIT BOARD CAPABLE OF PREVENTING ELECTRICAL SHORT DURING SOLDERING PROCESS

CLAIM OF PRIORITY

This application makes reference to, incorporates the same herein, and claims all benefits accruing under 35 U.S.C. §119 from my application PRINTED CIRCUIT BOARD CAPABLE OF PREVENTING ELECTRICAL SHORT DURING SOLDERING PROCESS filed with the Korean Industrial Property Office on Mar. 13, 1999 and there duly assigned Serial No. 8509/1999.

BACKGROUND OF THE INVENTION

1. Field of the Invention

The present invention relates to a printed circuit board, more particularly the printed circuit board capable of preventing electrical short during a soldering process.

2. Related Art

In a process of mass production of an electronic assembly, the connection between components and a substrate is accomplished by a heat-follow method or wave soldering method. The wave soldering method is mainly applied to a substrate having hole type parts. A method for connecting the component and the substrate by wave soldering is disclosed in U.S. Pat. No. 5,000,691, to Olsson et al., entitled Pin Fastened To A Printed Circuit Board By Soldering, and U.S. Pat. No. 5,092,035, to McMichen et al., entitled Method Of Making Printed Circuit Board Assembly. In a process of connecting a hole part, the width of the conveyor of a general wave soldering machine and the temperature of a solder spot are controlled to be matched to the dimension of each printed circuit board. However adequately controlled conditions are during the soldering process of a substrate, though, unexpected problems, for example an open joint due to lack of solder or a bridge joint due to excess solder, may occur.

The problem of a short-circuit, or "short", on a printed circuit board during wave soldering occurs as follows. A printed board incorporating a semiconductor device, for example a connector, is preheated at a predetermined temperature to match a condition for soldering. Then the heated printed board is passed through a pot containing molten solder, called the solder pot, to be heated at a predetermined temperature. On the lower surface of the printed board, pins of the connector protrude downward through holes formed in the printed board. The protruding pins of the printed board are soldered by wave soldering during the passage through the solder pot. In this state, the printed board is carried by a conveyor at a constant speed. Protruding pins of the printed board are skimmed along the surface of the molten solder in the solder pot. Therefore, a first pin protruding from a first hole is soldered and gradually a second pin of a second hole is soldered.

During the soldering process, some amount of the solder is pushed and flows along the line passing through the first hole and the second hole on the lower surface of the printed board covered with solder mask. Explaining in more detail, the lower surface of the printed board is covered with a solder mask to prevent soldering on the surface, but the solder mask is taken off at the region of the hole of the printed board, therefore the region of the hole is the region capable of being soldered. As mentioned above, some amount of solder mounted on the lower surface is not soldered to the region covered with solder mask and is pushed to the opposite direction of the moving direction of the printed board in regular sequence. But, when the pushed solder reaches the second hole in front to the patterns, there is no further passage to flow. Therefore, some amount of solder not flowing backward remains at the holes in front of patterns, which causes problems. An excess amount of the solder of adjacent holes are connected with each other, which yields a short. Also, an excess amount of the solder remaining in the hole is connected with adjacent pattern lines, which yields a short. When a short occurs, it is necessary to eliminate the zone producing an electrical short on the printed board, therefore labor and time for eliminating the zone are added to the production cost, raising the production cost and lowering the production efficiency.

Examples of the contemporary art of printed circuit board structures and methods for preventing electrical shorts due to bridging during soldering are seen in the following U.S. Patents. U.S. Pat. No. 4,339,784, to Shearer, entitled Solder Draw Pad, describes a printed circuit board provided with an additional foil pad arranged in line with a row of leads, which reduces bridging between adjacent leads during wave soldering.

U.S. Pat. No. 4,835,345, to Haarde, entitled Printed Wiring Board Having Robber Pads For Excess Solder, describes a printed wiring board with a solder pad of a special configuration at the downstream end of a linear array of solder pads. The downstream solder pad has an extra solder pad, or "robber pad", connected to the downstream pad by a solder-wettable bridge. The "robber pad" and bridge are made of a solder-wettable, clean metal surface such as a fluxed, tinned, copper surface, and apparently are generally made of the same material as the solder pad.

U.S. Pat. No. 5,242,100, to Weeks, entitled Plated-Through Interconnect Solder Thief, describes a plated-through hole solder thief for inhibiting solder bridges between adjacent leads. The plated-through holes are located in the proximity of the last solder pad in a row of solder pads. Applicability to hole-mounted integrated circuits is also described.

U.S. Pat. No. 5,243,143, to Throop et al., entitled Solder Snap Bar, discloses a printed circuit board in which a snap bar is provided on the conductor side of a printed circuit board for reducing defect, including bridging, during soldering. The "snap bar" is a portion of the circuit board's conductor side which attracts excess solder from the leads, but is spaced away from the solder pads. As illustrated, the snap bar is a rectangular bar on the trailing edge of the solder pads. The snap bar is described as a clean metal surface which is fluxed prior to the wave soldering, and the snap bar is apparently generally made of the same material and by the same procedure as the solder pads of the printed circuit board.

U.S. Pat. No. 5,604,333, to Kennish et al., entitled Process And Structure For A Solder Thief On Circuit Boards, describes a process for minimizing solder bridges during wave soldering. Solder thieves are placed adjacent to a last pad of a series of pads, where the solder thief is approximately the same width and twice the length of the pad. The solder thief touches the last pad, and may be an extension of the last pad. The solder thief is made as an additional pad, and is apparently made of the same material as the other pads.

However, these methods and apparatus require additional pattern structure on the printed circuit board. Moreover, solder bridging is not always eliminated by these methods.

SUMMARY OF THE INVENTION

Therefore, it is an object of the present invention to provide an improved printed circuit board for wave soldering.

A further object of the present invention is to provide a printed circuit board capable of preventing an electrical short due to solidification of excess solder at the special point on the bottom side of the printed circuit board during a wave soldering process.

A still further object of the present invention is to provide an improved method of wave soldering.

A yet further object of the invention is to provide a method which lowers the cost and the production time.

In order to attain the above objects, according to an aspect of the present invention, there is provided a printed circuit board containing pin-through holes, which includes components for mounting on the printed circuit board to be electrically connected with the printed circuit board, wherein each of the components includes a plurality of pins for inserting into the pin-through holes, patterns formed on the printed circuit board, wherein the patterns are located adjacent to a last one hole among the arranged pin-through holes, and at least one zone formed on at least one of the patterns, wherein a surface of the at least one zone is capable of being soldered, and wherein the at least one zone is formed on the same line passing through the plurality of pins and to absorb an excess amount of the solder at the last one hole, which prevents an electrical short due to the excess solidification of the solder at the last solder.

In the printed circuit board according to the invention, the at least one zone includes a region in which a solder mask covering surfaces of the patterns is stripped off. Here, the "stripped off" region may be stripped off after the solder mask is applied, or may be a region in which no solder mask is applied.

Furthermore, in the printed circuit board, the at least one zone is formed in turn on the patterns. Still further, in the printed circuit board, a size of the at least one zone is gradually reduced in proportion to the interval between the last hole and the at least one zone.

According to another aspect of this invention, there is provided a printed circuit board containing pin-through holes which includes components for mounting on the printed circuit board to be electrically connected with the printed circuit board, wherein each of the components includes a plurality of pins for inserting into the pin-through holes, and a dummy zone formed on the printed circuit board, wherein the dummy zone is located adjacent to a last one hole among the arranged pin-through holes, wherein a surface of the dummy zone is capable of being soldered, and wherein the dummy zone is formed on the same line passing through the plurality of pins and to absorb an excess amount of the solder at the last hole, which prevents an electrical short due to the excess solidification of the solder at the last solder.

In the printed circuit board according to the invention, the dummy zone includes a region in which a solder mask covering surfaces of the printed circuit board is stripped off. Furthermore, in the printed circuit board, the dummy zone is located at an opposite direction to a moving direction of the printed circuit board during a soldering process.

Still further, in the printed circuit board, the dummy zone includes a first portion spaced apart from the last hole and a second portion to connect the first portion with the last hole. Still further, in the printed circuit board, the width of the second portion is smaller than a radius of the last hole.

The present invention will be better understood from the following detailed description of the exemplary embodiment thereof taken in conjunction with the accompanying drawings, and its scope will be pointed out in the appended claims.

BRIEF DESCRIPTION OF THE DRAWINGS

A more complete appreciation of the present invention, and many of the attendant advantages thereof, will become readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
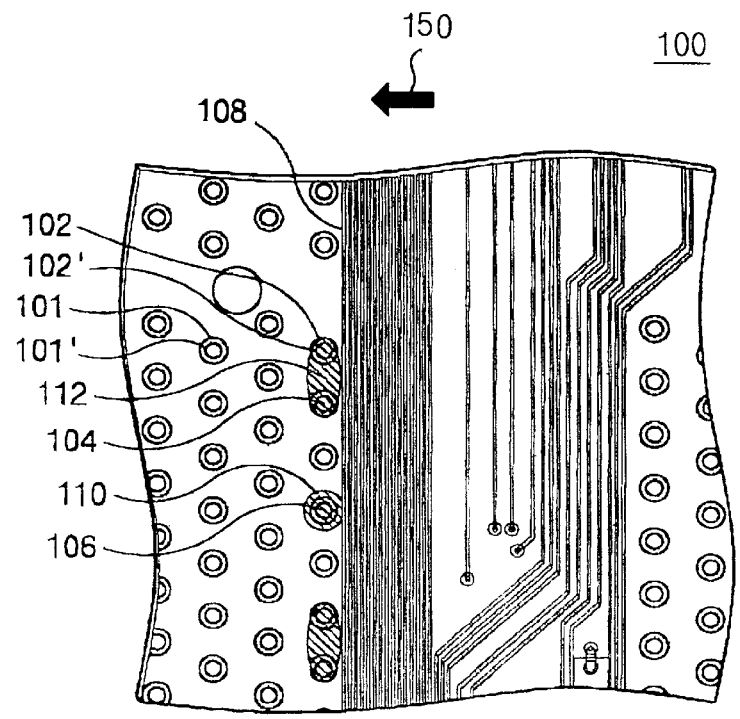
FIG. 1 is a diagram for showing an occurrence of short on a printed board.

Turning now to the drawings, FIG. 1 illustrates an occurrence of short-circuit, or "short", on a printed circuit board, as described above. Referring to FIG. 1, printed board 100 incorporating a semiconductor device, for example a connector, is preheated at a predetermined temperature to match a condition for soldering. Then the heated printed board 100 is passed through a pot containing molten solder, called the solder pot, to be heated at a predetermined temperature. On the lower surface, pins of the connector protrude downward through holes 101, 102, 104 and 106 formed on the printed board 100. The protruding pins of the printed board 100 are soldered by wave soldering during the passage of the solder pot. In this state, the printed board 100 is carried in arrow direction 150 (shown in FIG. 1) by a conveyor (not shown in FIG. 1) at a constant speed. Protruding pins of the printed board 100 are skimmed along the surface of the molten solder in the solder pot. Therefore, a first pin 101' protruding from a first hole 101 is soldered and gradually a second pin 102' of a second hole 102 is soldered.

During the soldering process, some amount of the solder is pushed and flows along the line passing through the first hole 101 and the second hole 102 on the lower surface of the printed board covered with solder mask. To explain in greater detail, the lower surface of the printed board is covered with a solder mask to prevent soldering on the surface, but the solder mask is taken off at the region of the hole of the printed board, therefore the region of the hole is the region capable of soldering. As mentioned above, some amount of solder mounted on the lower surface is not soldered to the region covered with solder mask and is pushed to the opposite direction of the moving direction of the printed board in regular sequence. But, when the pushed solder reaches the second hole 102 in front to the patterns 108, there is no further passage to flow. Therefore, some amount of solder not flowing backward remains at the holes 102, 104 and 106 in front of patterns, which causes problems. Referring to FIG. 1, excess amount of the solder of the hole 104 and excess amount of the solder of the hole 102 are connected with each other, which yields short 112. Also, excess amount of the solder remained in the hole 106 is connected with the patterns, which yields short 110. When a short occurs, it is necessary to eliminate the zone produced an electrical short on the printed board 100, therefore labor and time for eliminating the zone are added to the production cost, raising the production cost and lowering the production efficiency.

The invention will now be described in detail with reference to the drawings. It should be understood that the description of these embodiments of the invention is merely illustrative and that should not be taken in a limiting sense. In the following detailed description, several specific details are set forth in order to provide a thorough understanding of the present invention. It will be obvious, however, to one skilled in the art that the present invention may be practiced without these specific details.

Figure 2:
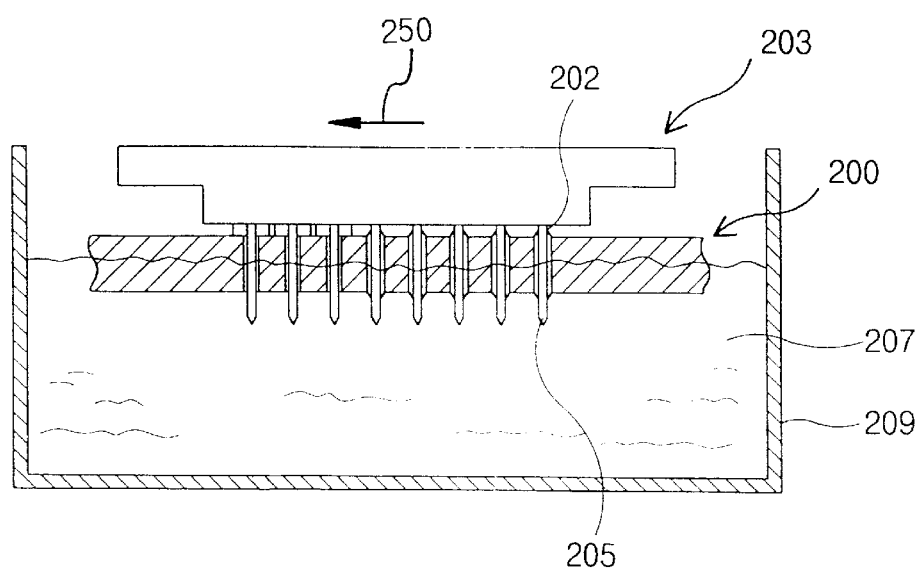
FIG. 2 is a diagram for showing a soldering process of the printed board by a wave soldering.

Referring to FIG. 2, wave soldering is a method which has been used in the industry to automatically solder components on a printed circuit board, an operation previously done by hand. A typical wave soldering machine includes at least one preheating zone to preheat the printed circuit board, at least one soldering zone to solder the components to the board by coating the bottom side of the printed circuit board with molten solder contained in a solder pot, and at least one cooling zone where the solder is solidified.

Semiconductor components are mounted on the printed circuit board, and by a transport rail, the printed circuit board is carried in the arrow direction 250 (shown in FIG. 2) under the condition of sinking under the surface of the molten solder. In this state, in through holes formed on the printed circuit board, hot solder is pulled to the gap between the protruding pin and the hole by force of tension and capillary action phenomena, and the pin is firmly maintained on the printed circuit board by the solidification of the solder.

To be connected with the printed circuit board 200, semiconductor components, for example a connector 203, are mounted on the printed circuit board 200. Pins 205 of the connector 203 are inserted into the holes 202 formed on the printed circuit board 200. An inner surface of the holes 202 is a gold-plated surface which improves conductivity and contact. As mentioned above, a protruding pin 205 from a bottom surface of the printed circuit board 200 is at first preheated, then passed along the surface of the molten solder 207 of the solder pot 209 to be connected and maintained on the printed circuit board 200. In this state, the bottom surface of printed circuit board 200 is sunk under the surface of the molten solder 207. A protruding pin of the components and the bottom side of the printed circuit board are coated with molten solder contained in a solder pot, then the components are firmly connected to the printed circuit board as the molten solder is solidified.

Figure 3:
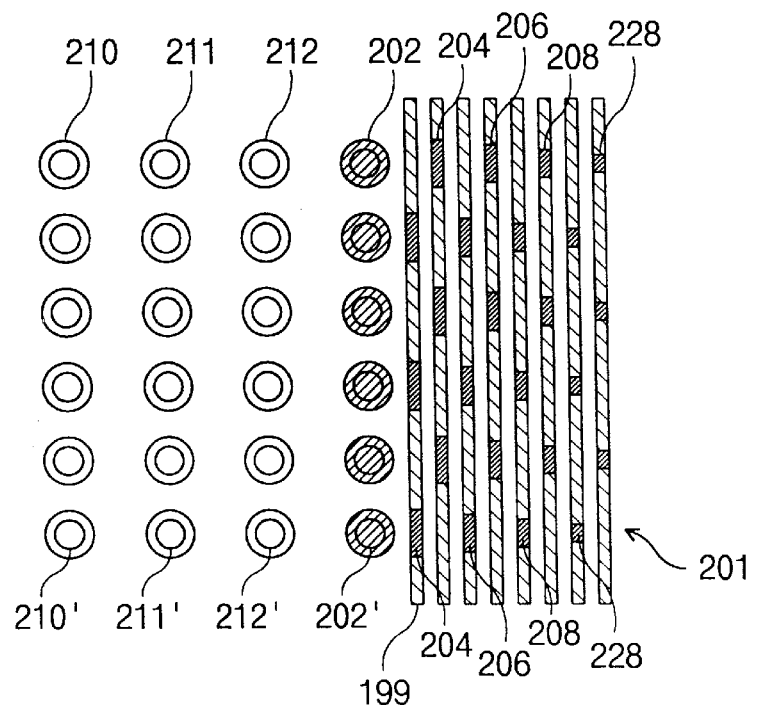
FIG. 3 is a diagram for showing a printed board according to a first embodiment of the present invention.

Referring to FIG. 3, successive columns of holes 210, 211, 212 and 202 (vertical in FIG. 3) are formed to make rows (horizontal in FIG. 3) on the bottom side of the printed circuit board. A plurality of patterns 201 are formed next to the last column of holes 202. During the soldering process, a first pin 210' of a first hole 210 is soldered, and a second pin 211' of a second hole 211 and a third pin 212' of a third hole 212 are gradually soldered. Finally, a fourth pin 202' of a fourth hole 202 is soldered.

In the first embodiment of the present invention, a passage for smoothing flow of the molten solder is formed on the patterns 201 next to the fourth hole 202. On the patterns 201, a plurality of zones 204, 206, 208 and 228 in which a solder mask covering the patterns is stripped off, which will here be called soldering zones, are formed alternately to prevent an electrical short. Here, the "stripped off" region of the solder mask defining the soldering zone may be stripped off after the solder mask is applied, or may refer to a region in which solder mask is not applied. In the example shown in FIG. 3, the soldering zones are located on alternate pattern lines and aligned with alternate rows in a checkerboard fashion.

The further the location of the soldering zone from the fourth hole 202, the smaller is made the size of the soldering zone. The soldering zones 204, 206, 208 and 228 are regions capable of being soldered, therefore soldering zones formed on the patterns 201 make the flow of the molten solder smooth on the bottom side of the printed circuit board 200. As a result of forming soldering zones, adequate solder is soldered at the fourth hole 202 and the remaining amount of the solder is gradually soldered at soldering zones. FIG. 3, illustrates one possible arrangement for the soldering zones. The narrower the distance between the first soldering zone and the fourth hole, the higher the possibility of the occurrence of the electrical short. Therefore, the first soldering zone is generally not formed on the pattern next to the fourth hole 202. However if the distance between the first soldering zone and the fourth hole is sufficient, it is possible for the first soldering zone to be arranged on the pattern 199 next to the fourth hole 202 as shown in FIG. 3. Thus the soldering zone is generally near the fourth hole, but not so near as to allow a solder bridge to form, yielding a short. Compared to the conventional printed circuit board, the occurrence of electrical shorts due to solidification of excess solder at the special point, for example pin-hole ahead of the patterns, are greatly reduced.

In the first embodiment of the present invention, a length of a first soldering zone 204 along the pattern line is approximately 80% of that of the diameter of fourth hole 202, a size of a second soldering zone 206 is approximately 60% of that of the fourth hole 202, a size of a third soldering zone 208 is approximately 40% of that of the fourth hole 202 and a size of a fourth soldering zone 228 is approximately 20% of that of the fourth hole 202. Other sizes for the soldering zones may be used, and it is also possible to use more or fewer than four soldering zones per row.

Figure 4:
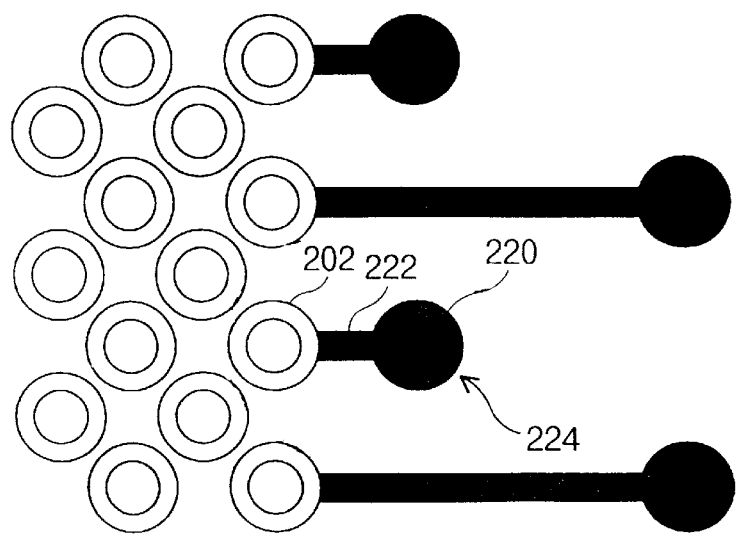
FIG. 4 is a diagram for showing a printed board according to a second embodiment of the present invention.

Referring to FIG. 4, a second embodiment of the present invention is shown. As mentioned above, one method for preventing the electrical short on the hole on the bottom side of the printed circuit board 200 is forming soldering zones capable of being soldered on patterns. But it is sometimes difficult to form soldering zones on patterns. Therefore in the second embodiment of the present invention, a dummy land 224 is formed adjacent to the fourth hole 202. The dummy land 224 is also stripped off the solder mask to be soldered, and comprises a round portion 220 and a connecting portion 222. The round portion 220 is formed to have the same size of the fourth hole 202. And the connecting portion 222 performs the role of connecting the round portion 220 and the fourth hole 202. In this state, the excess amount of the molten solder does not stay at the fourth hole 202 but flows to the round portion 220 of the dummy land 224 through the connecting portion 222. As shown in FIG. 4, different shapes of the dummy land 224 are possible. In the example illustrated in FIG. 4, dummy lands with different length connecting portions are formed on alternate rows. Therefore, electrical shorts due to solidification of excess solder at the special point are prevented.

According to the first embodiment and the second embodiment of the present invention, it is possible to prevent electrical shorts due to solidification of excess solder at the special point on the bottom side of the printed circuit board. Therefore, the labor and time required for eliminating special zones generating the electrical short are reduced. And production efficiency is also improved according to a reduction of the production time.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. An item for wave soldering, comprising:
    a printed circuit board including a plurality of holes including a first row of holes, and each hole of the plurality of holes including a plated inner surface, said first row of holes being formed in a first direction extending from a first hole at one end of the first row of holes to a last hole at the opposite end of the first row of holes;
    a component on a top surface of the printed circuit board, said component having a plurality of pins passing downward through corresponding holes of the plurality of holes and protruding on a bottom surface of the printed circuit board; and
    a solder mask formed on a portion of the bottom surface of the printed circuit board, said solder mask being stripped from the printed circuit board to define a first soldering zone adjacent to, and in said first direction from, said last hole of said first row of holes, said first soldering zone being shaped in the form of a dummy land connected to said last hole of said first row of holes.

2. The item of claim 1, further comprised of said dummy land comprising:
    a first round portion separate from said last hole of said first row of holes and being located in said first direction from said last hole of said first row of holes; and
    a first connecting portion, said first connecting portion being narrower than said last hole of said first row of holes and narrower than said first round portion, said first connecting portion extending from said last hole of said first row of holes to said first round portion.

3. The item of claim 2, further comprising:
    said printed circuit board including a second row of holes of said plurality of holes formed in parallel relation to said first row of holes, a last hole of said second row of holes being located in a columnar orientation to said last hole of said first row of holes; and
    said solder mask being stripped from the printed circuit board to define a second soldering zone adjacent to, and in said first direction from, said last hole of said second row of holes, said second soldering zone comprising:
        a second round portion separate from and located in said first direction from said last hole of said second row of holes at a different distance than said first round portion from said last hole of said first row of holes; and
        a second connecting portion, said second connecting portion being narrower than said last hole of said second row of holes and narrower than said second round portion, said second connecting portion extending from said last hole of said second row of holes to said second round portion.

4. An item for wave soldering, comprising:
    a printed circuit board including a plurality of holes arranged in a plurality of rows and a plurality of columns;
    a component on a top surface of the printed circuit board, said component having a plurality of pins passing downward through corresponding holes of the plurality of holes and protruding from a bottom surface of the printed circuit board;
    a plurality of solderable patterns arranged in parallel columns adjacent to at least one of said plurality of columns of holes;
    a solder mask formed on a bottom surface of the printed circuit board, said solder mask being stripped from portions of said printed circuit board to define a plurality of separate soldering zones on each of said plurality of solderable patterns, wherein solder adheres to said plurality of separate soldering zones when said pins passing downward through corresponding holes are soldered to said corresponding holes in a wave soldering process.

5. The item as set forth in claim 4, wherein each said separate soldering zone on a first solderable pattern closest to said at least one of said plurality of columns of holes are respectively aligned only with even rows of said plurality of rows of holes, and each said separate soldering zone on a second solderable pattern adjacent said first solderable pattern are respectively aligned only with odd rows of said plurality of rows of holes.

6. The item as set forth in claim 5, wherein a length of each said separate soldering zone on the first solderable pattern is approximately 20% smaller than a diameter of said holes and a length of each said separate soldering zone on the second solderable pattern is approximately 20% smaller than the diameter of said holes.

7. The item as set forth in claim 6, wherein each said separate soldering zone on a third solderable pattern adjacent said second solderable pattern are respectively aligned only with said even rows of said plurality of rows of holes, and each said separate soldering zone on a fourth solderable pattern adjacent said third solderable pattern are respectively aligned only with said odd rows of said plurality of rows of holes.

8. The item as set forth in claim 7, wherein a length of each said separate soldering zone on the third solderable pattern is approximately 40% smaller than the diameter of said holes and a length of each said separate soldering zone on the fourth solderable pattern is approximately 40% smaller than the diameter of said holes.

9. The item as set forth in claim 8, wherein each said separate soldering zone on a fifth solderable pattern adjacent said fourth solderable pattern are respectively aligned only with said even rows of said plurality of rows of holes, and each said separate soldering zone on a sixth solderable pattern adjacent said fifth solderable pattern are respectively aligned only with said odd rows of said plurality of rows of holes.

10. The item as set forth in claim 9, wherein a length of each said separate soldering zone on the fifth solderable pattern is approximately 60% smaller than the diameter of said holes and a length of each said separate soldering zone on the sixth solderable pattern is approximately 60% smaller than the diameter of said holes.

11. The item as set forth in claim 10, wherein each said separate soldering zone on a seventh solderable pattern adjacent said sixth solderable pattern are respectively aligned only with said even rows of said plurality of rows of holes, and each said separate soldering zone on a eighth solderable pattern adjacent said seventh solderable pattern are respectively aligned only with said odd rows of said plurality of rows of holes.

12. The item as set forth in claim 11, wherein a length of each said separate soldering zone on the seventh solderable pattern is approximately 80% smaller than the diameter of said holes and a length of each said separate soldering zone on the eighth solderable pattern is approximately 80% smaller than the diameter of said holes.

13. A printed circuit board including a plurality of holes arranged in a plurality of rows and a plurality of columns for wave soldering a component to the printed circuit board, said component having a plurality of pins passing downward through corresponding holes of the plurality of holes and protruding from a bottom surface of the printed circuit board, the printed circuit board comprising:

a plurality of separate soldering zones arranged in alignment with said plurality of rows, said separate soldering zones being arranged in at least two columns characterized in that each said separate soldering zone in a first column closest to at least one of said plurality of columns of holes are respectively aligned only with even rows of said plurality of rows of holes, and each said separate soldering zone in a second column adjacent said first column are respectively aligned only with odd rows of said plurality of rows of holes;

a solder mask formed on a bottom surface of the printed circuit board, said solder mask being stripped from portions of said printed circuit board to define said plurality of separate soldering zones, wherein solder adheres to said plurality of separate soldering zones when said pins passing downward through corresponding holes are soldered to said corresponding holes in a wave soldering process.

14. The printed circuit board as set forth in claim 13, wherein each of said soldering zones are shaped in the form of a dummy land respectively connected to a last hole in said even and odd rows of holes.

15. The printed circuit board as set forth in claim 14, each of said dummy lands comprising:

a round portion separate from said last hole of said first row of holes and being located in said first direction from said respective last hole, said round portion having a size equal to a size of said last hole; and an elongated connecting portion connecting said last hole to said first round portion, said elongated connecting portion being narrower than said last hole and said round portion.

16. The printed circuit board as set forth in claim 13, further comprising a plurality of solderable patterns arranged in parallel columns adjacent to said at least one of said plurality of columns of holes, wherein each of said soldering zones are defined by said solder mask being stripped from portions of said solderable patterns.

17. The printed circuit board as set forth in claim 16, wherein each said separate soldering zone on a first solderable pattern closest to said at least one of said plurality of columns of holes are respectively aligned only with said even rows of said plurality of rows of holes, and each said separate soldering zone on a second solderable pattern adjacent said first solderable pattern are respectively aligned only with said odd rows of said plurality of rows of holes.

18. The item as set forth in claim 17, wherein a length of each said separate soldering zone on the first solderable pattern is approximately 20% smaller than a diameter of said holes and a length of each said separate soldering zone on the second solderable pattern is approximately 20% smaller than the diameter of said holes.

19. The item as set forth in claim 18, wherein each said separate soldering zone on a third solderable pattern adjacent said second solderable pattern are respectively aligned only with said even rows of said plurality of rows of holes, and each said separate soldering zone on a fourth solderable pattern adjacent said third solderable pattern are respectively aligned only with said odd rows of said plurality of rows of holes.

20. The item as set forth in claim 19, wherein a length of each said separate soldering zone on the third solderable pattern is approximately 40% smaller than the diameter of said holes and a length of each said separate soldering zone on the fourth solderable pattern is approximately 40% smaller than the diameter of said holes.

21. The item as set forth in claim 20, wherein each said separate soldering zone on a fifth solderable pattern adjacent said fourth solderable pattern are respectively aligned only with said even rows of said plurality of rows of holes, and each said separate soldering zone on a sixth solderable pattern adjacent said fifth solderable pattern are respectively aligned only with said odd rows of said plurality of rows of holes.

22. The item as set forth in claim 21, wherein a length of each said separate soldering zone on the fifth solderable pattern is approximately 60% smaller than the diameter of said holes and a length of each said separate soldering zone on the sixth solderable pattern is approximately 60% smaller than the diameter of said holes.

23. The item as set forth in claim 22, wherein each said separate soldering zone on a seventh solderable pattern adjacent said sixth solderable pattern are respectively aligned only with said even rows of said plurality of rows of holes, and each said separate soldering zone on a eighth solderable pattern adjacent said seventh solderable pattern are respectively aligned only with said odd rows of said plurality of rows of holes.

24. The item as set forth in claim 23, wherein a length of each said separate soldering zone on the seventh solderable pattern is approximately 80% smaller than the diameter of said holes and a length of each said separate soldering zone on the eighth solderable pattern is approximately 80% smaller than the diameter of said holes.

* * * * *